United States Patent

Krauss

[11] Patent Number: 6,086,126
[45] Date of Patent: Jul. 11, 2000

[54] GRIPPER FOR FLAT COMPONENTS

[75] Inventor: Rainer Krauss, Neckarwestheim, Germany

[73] Assignee: Systronic Maschinen GmbH, Flein, Germany

[21] Appl. No.: 09/167,946

[22] Filed: Oct. 7, 1998

[30] Foreign Application Priority Data

Jul. 10, 1997 [EP] European Pat. Off. ............. 97117335

[51] Int. Cl.[7] ........................................ B66C 1/48
[52] U.S. Cl. ............................. 294/104; 294/116
[58] Field of Search ..................... 294/104, 101, 294/106, 99.1; 414/116, 753.1

[56] References Cited

U.S. PATENT DOCUMENTS

| | | | |
|---|---|---|---|
| 2,446,610 | 8/1948 | Renfroe | 294/104 |
| 2,549,918 | 4/1951 | Miller . | |
| 2,654,630 | 10/1953 | Renfroe | 294/104 |
| 3,171,178 | 3/1965 | Smith et al. | 294/104 |
| 3,336,068 | 8/1967 | Renfore | 294/101 |
| 4,113,298 | 9/1978 | Kopp | 294/104 |
| 4,162,804 | 7/1979 | Davies | 294/104 |

FOREIGN PATENT DOCUMENTS

| | | |
|---|---|---|
| 458301 | 12/1936 | European Pat. Off. . |
| 589389 | 6/1947 | European Pat. Off. . |
| 2 610 678 | 2/1988 | France . |
| 741956 | 12/1955 | United Kingdom ................... 294/104 |
| 0463838 | 1/1992 | United Kingdom ................... 294/101 |

Primary Examiner—Dean J. Kramer
Assistant Examiner—Paul T. Chin
Attorney, Agent, or Firm—Rader, Fishman, Grauer & McGarry, a office of Rader Fishman Grauer PLLC

[57] ABSTRACT

The invention concerns a gripper for flat components (38), in particular for circuit boards and circuit foils. The gripper (10) has a gripping slot (20) for holding the component (38) and a clamping element that is tensioned in the direction of the slot opening (22). The clamping element (26) can be pivoted between a clamping position, in which it protrudes into the gripping slot (20) and clamps the component, and an open position in which it is pivoted at least partially out of the gripping slot (20).

8 Claims, 4 Drawing Sheets

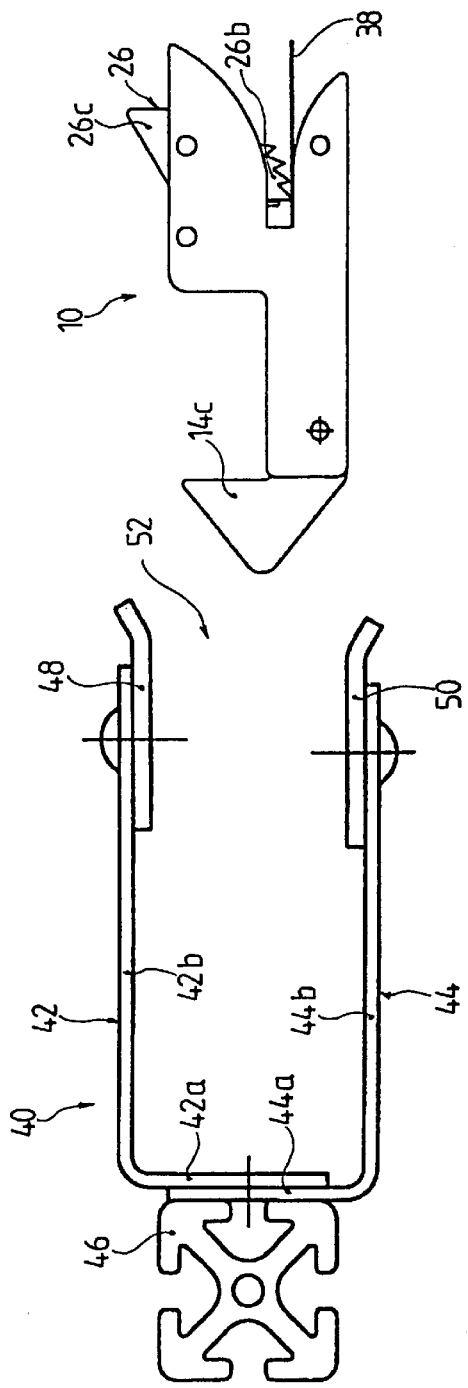
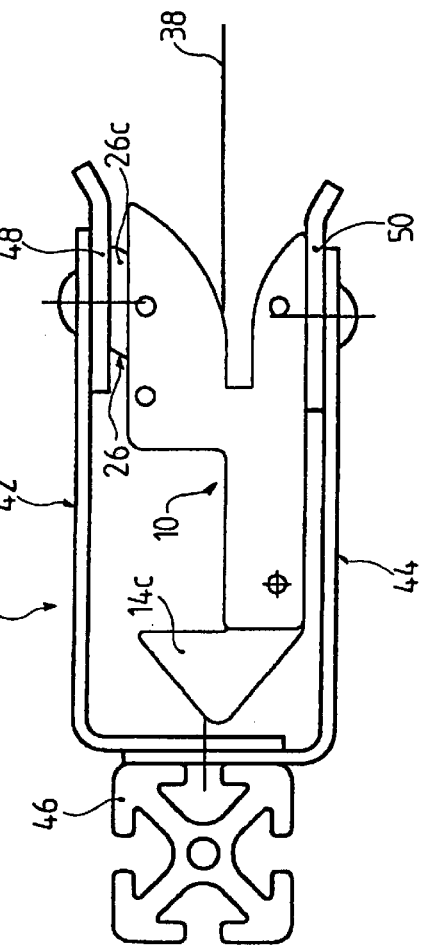
Fig.5
Fig.6

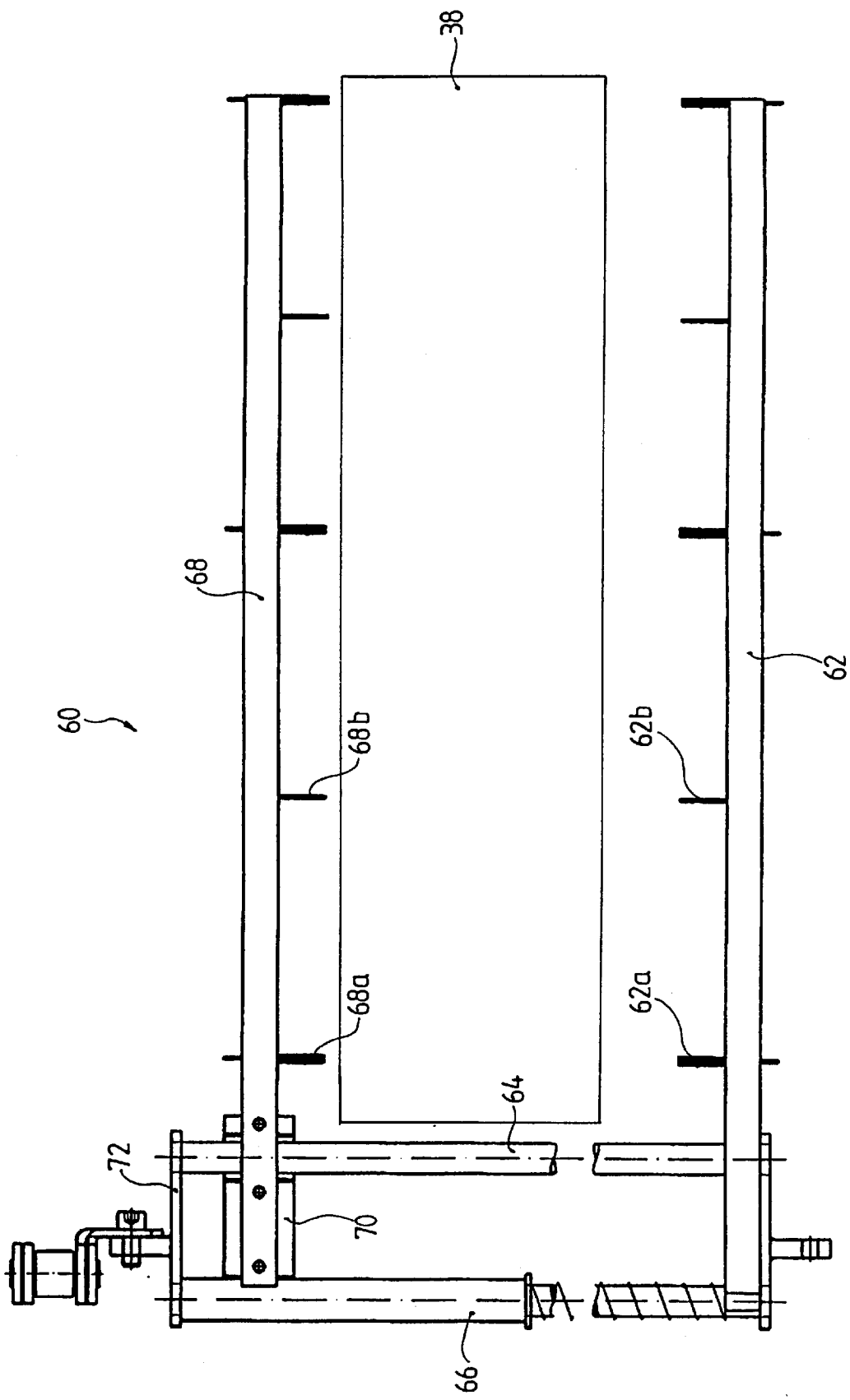

GRIPPER FOR FLAT COMPONENTS

RELATED PATENT APPLICATIONS

The application claims priority on European Patent No. 97 117 335.6 filed Oct. 7, 1997.

BACKGROUND OF THE INVENTION

1. Field of the Invention

The invention concerns a gripper for flat components and in particular for circuit boards and circuit foils. More particularly, the invention concerns a gripper system for transporting the flat components during assembly.

2. Related Art

The manufacturing process for flat components, such as, for example, circuit boards and circuit foils, is usually subdivided into several production steps. During their manufacture, circuit boards and circuit foils are thus, for example, exposed, etched, cleaned, lacquered, and also dried. During the transport of these flat components, between the individual production stations as well as in them, they are usually held by a gripper in order to make the transport of the mostly very thin components easier. Clamps, pincers, or similar devices, for example, are used as grippers into which the flat components are inserted and then fixed through the manual operation of a lever or a clamping device. With these known grippers there is the danger of sensitive, flat components, such as circuit boards and circuit foils, sustaining damage during the manual insertion into the gripper or while being clamped by the gripper.

A gripper is known from the U.S. Pat. No. 2,549,918, with whose aid flat components such as steel sheets can be picked up and held by hand. The gripper has a gripping slot for receiving the steel sheet and a clamping element that is spring-loaded in the direction of the slot opening. The clamping element can be moved between a clamping position, in which it protrudes into the gripping slot in order to clamp a steel sheet that is inserted into the gripping slot, and an open position in which it is pivoted at least partially out of the gripping slot. A setting segment juts out from the clamping element in the form of a lever, which is operated manually to move the clamping element from the clamping position into the open position. Because of its nature, in particular the arrangement and shape of its positioning segment, this known gripper is only suitable for the manual handling of steel sheets. The known gripper could only be used in automated production facilities through additional measures, for instance through the use of an actuator with which the positioning segment for opening the gripper can be operated.

SUMMARY OF THE INVENTION

It is the task of the invention to further develop a gripper of the type described at the beginning in such a way that the gripper can be operated automatically, trouble-free, and in a simple manner, or rather to provide a gripper system with at least one gripper for flat components with which this task can be accomplished.

The task is solved through a gripper with the characteristics in accordance with the invention. The task is furthermore solved through multiple cooperating grippers. Advantageous further developments are defined by the respective sub-claims of the main patent claims.

With the invention, the gripper can be opened automatically by moving it in a direction parallel to the length of the gripping slot and away from the slot opening, and moving the positioning segment of the clamping element against a fixed edge. Through the motion of the gripper, the positioning segment is pressed onto the top of the gripper by the fixed edge, which pivots the clamping element from its clamping position to its open position, and causes the gripper to release the gripped component. The positioning surface, which rises in the direction of the slot opening and is created by the positioning segment when the clamping element is pivoted into the clamping position, makes the engagement of the positioning segment with the fixed edge easier and effects a continuous pivoting of the clamping element.

In the open position of the clamping element, the positioning surface of the setting segment, being parallel to the surface of the gripper, makes the disengagement of the positioning segment from the fixed edge easier. Here, as with the engagement of the positioning segment with the fixed edge, the trouble-free, automatic operation of the gripper is also possible in a simple manner. The shape and arrangement of the positioning segment on the gripper, according to the invention, allow the gripper to be moved continuously along the fixed edge in the same direction in order to open the clamping element, so that the gripper is also suited for production facilities in which components are transported continuously in the same direction.

Preferably, a clamping segment is formed on the clamping element that, in the clamping position, protrudes into the gripping slot. This clamping element has at least one shaped element that, in order to hold a component that is inserted into the gripping slot, engages the component's surface. The shaped element on the clamping element at the same time prevents the component that is clamped in the gripping slot from slipping or coming loose. For the shaped element, knurls or also teeth, for example, are suggested. It is furthermore possible to rough up the surface of the clamping segment. In a preferred version, the shaped element consists of several teeth arranged on a common arc. The clamping element is then attached to the gripper on a pivot in such a manner that the tooth closest to the end of the slot touches the opposite slot wall when the clamping element is in the clamping position and no component is inserted in the gripping slot. Because of the arrangement of the teeth on a common arc and the pivoting motion of the clamping element, the tooth closest to the surface of the component, depending on the thickness of the component, always engages the surface of the component.

To make the insertion of the component easier, it is furthermore suggested that the edges that bound the slot opening of the gripping slot be rounded in such a manner that the slot opening is widened. By means of the widening shape of the slot opening of the gripping slot, the component is guided into the narrowing gripping slot as soon as it comes into contact with the slot opening.

The invention furthermore concerns a gripper system that uses at least one first gripper in accordance with the invention and at least one further gripper in accordance with the invention in order to gently transport flat components. The gripper system has a first beam on which the first gripper is mounted, and a second beam that can be moved parallel to the first, on which the additional gripper is mounted. The gripping slot of the first gripper on the first beam is oriented toward the second beam. The gripping slot of the additional gripper, mounted on the second beam, is oriented toward the slot of the first gripper. By moving the second beam, it is possible to position a flat component, which is to be gripped, between the grippers. The second beam can then be moved in the direction of the first beam, which engages the first gripper with the edge of the flat component that faces it and the additional gripper into contact with the opposite edge of the flat component. To open the grippers, the gripper system can insert them into opening devices designed for that purpose.

For opening the gripper, an opening device may be used with the gripper system that, for instance, has a U-shaped cross-section with two L-sections at a distance to each other, between which the gripper can be inserted with its insertion end, opposite the gripping slot. To be opened, the gripper is inserted into the opening device in such a manner that the bottom of the gripper, opposite its top, comes into contact with one of the L-sections, and that the other L-section, adjoining the top, contacts a positioning segment of the clamping element protruding from the top of the gripper and pivots the clamping element into the open position during the insertion.

BRIEF DESCRIPTION OF THE DRAWINGS

Further characteristics and advantages of the invention are revealed in the following description, which uses an implementation example to explain the invention together with the included drawings. The figures show:

FIG. 5: is a side-view of an opening device for the gripper in accordance with FIG. 1 before the latter has been opened;

FIG. 6: is a side-view of the opening device in accordance with FIG. 5 while opening the gripper in accordance with FIG. 1; and FIG. 7: is a gripper system that uses several grippers in accordance with the invention.

DETAILED DESCRIPTION

Figure 1:
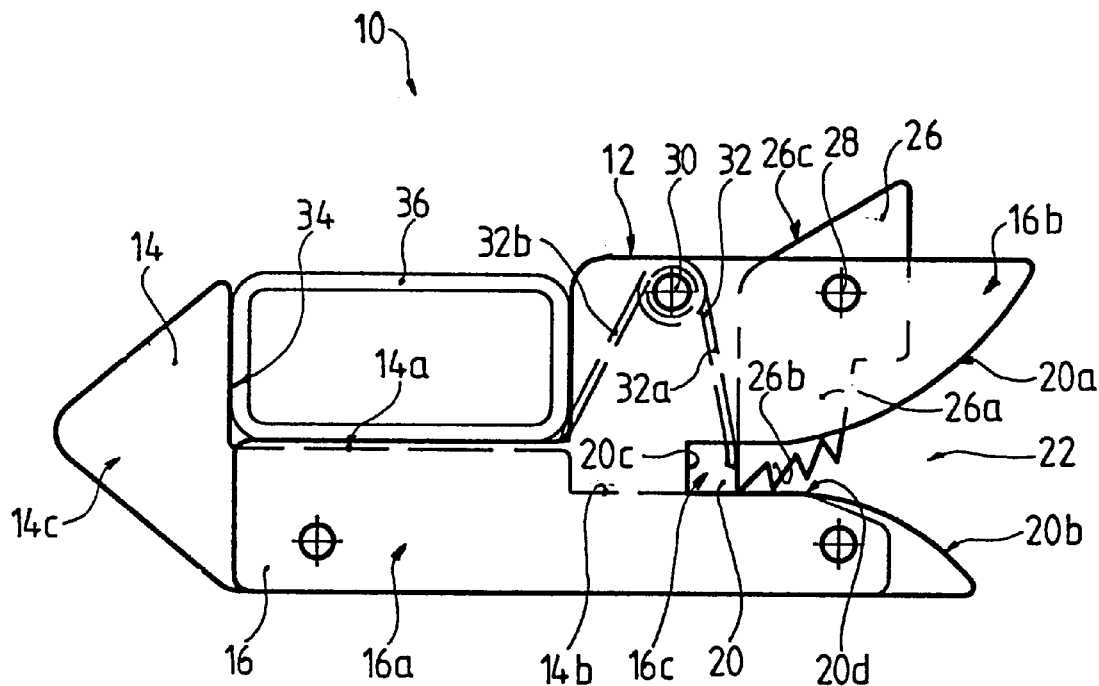
FIG. 1: is a side-view of a gripper in accordance with the invention.

In the following, the construction of a gripper (10), in accordance with the invention, is described more closely using FIGS. 1 and 2. The gripper (10) has a gripper body (12) that consists of a center plate (14), on each side of which a side plate (16 or rather 18) is fastened through the use of rivets.

The center plate (14) has a mounting segment (14a), a gripping segment (14b), and an insertion segment (14c). The mounting segment (14a) is rectangular in shape, and its end that is to the right in FIG. 1 goes over into the gripping segment (14b), forming a step. The gripping segment (14b) also has a rectangular shape, and is slightly sloped on its top edge. The other end of the mounting segment (14a) goes over into the insertion segment (14c), which has the shape of an isosceles triangle. The lower half, as viewed in FIG. 1, of edge of the insertion segment (14c) that constitutes the hypotenuse of the triangle, forms the transition into the mounting segment (14a).

The side plates (16 and 18) are identically shaped, so that only the side plate (16) shown in FIG. 1 will be described in the following. The side plate (16) has a mounting segment (16a) that, with its right end, as viewed in FIG. 1, goes over into the gripping segment (16b), forming a step. The gripping segment (16b) has a cutout on the end opposite the mounting segment (16a), that, together with a corresponding cutout on the side-plate (18) (not shown), defines a gripping slot (20). The gripping slot (20) is rounded on its edges (20a and 20b), which define a slot opening (22), and is enlarged toward the outside.

Figure 2:
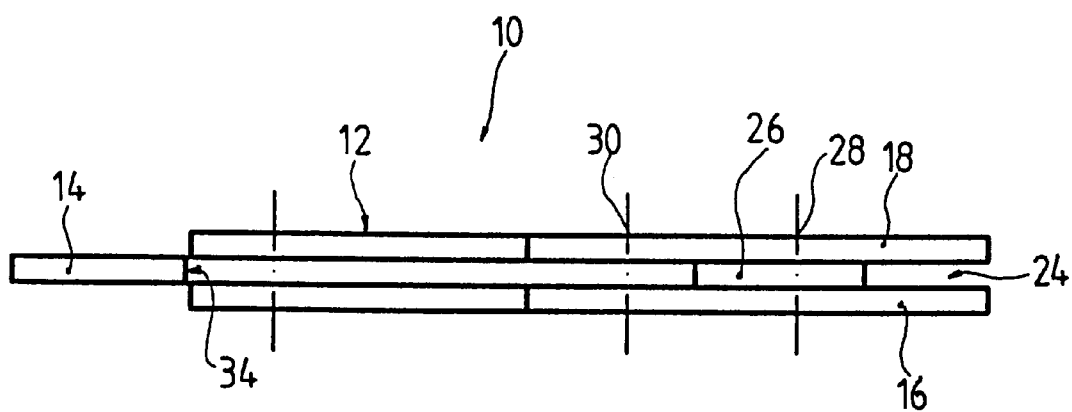
FIG. 2: is a top-view of the gripper in accordance with FIG. 1.

As FIG. 2 shows, a gap (24) is formed between the side plates (16 and 18), in which a clamping element (26) is positioned. The clamping element (26) is mounted movably on a pivot pin (28) that runs parallel to the slot opening (22) of the gripper body (12), juts through both side plates (16 and 18), and is fastened to them. The clamping element consists of a clamping segment (26a) that protrudes into the gripping slot (20) when the clamping element (26) is pivoted into a clamping position. The clamping segment (26a) has several teeth (26b) that are arranged on a common arc and engage a component that is inserted into the gripping slot (20) in order to hold it, as explained below. In the clamping position of the clamping element (26), when no component is inserted in the gripping slot (20), the tooth (26b) that is closest to the slot end (20c) of the gripping slot (20) contacts the gripping segment (14b) of the center plate (14). The clamping element (26) furthermore has a setting segment (26c), which connects to the clamping segment (26a). The setting segment (26c) has a sloped top, and it protrudes from the gripper body (12) and juts out from it when the clamping element (26) is in its clamping position. If the clamping element (26) is pivoted into an open position, in which the clamping segment (26a) is pivoted out of the gripping slot (20), the setting segment (26c) will be parallel to the top of the gripper body (12).

Behind the pivot pin (28), as seen from the slot opening (22), and parallel to it, is a fixing pin (30) that also juts through the side plates (16 and 18) and is fastened to them. A torsion spring (32) is mounted on the fixing pin (30), between the two side plates (16 and 18). With one of its spring ends (32a), the torsion spring (32) rests against the side of the clamping element (26) facing the torsion spring. The other spring end (32b) protrudes into a rectangular void bounded by the side plates (16 and 18) and the insertion segment (14c) of the center plate (14). This void (34) holds a hollow section (36) with a rectangular cross-section, to which the gripper body (12) is fastened. The spring end (32b) of the torsion spring (32) that protrudes into the void is braced by the hollow section (36), which tensions the torsion spring (32). The tension of the torsion spring (32) tensions the clamping element (26) elastically in the direction of the slot opening (22), which causes the clamping element (26) to come in contact with the gripping segment (14b) of the center plate (14) with the tooth (26b) that is closest to the slot end (20c) of the gripping slot (20), as already described above.

Figure 3:
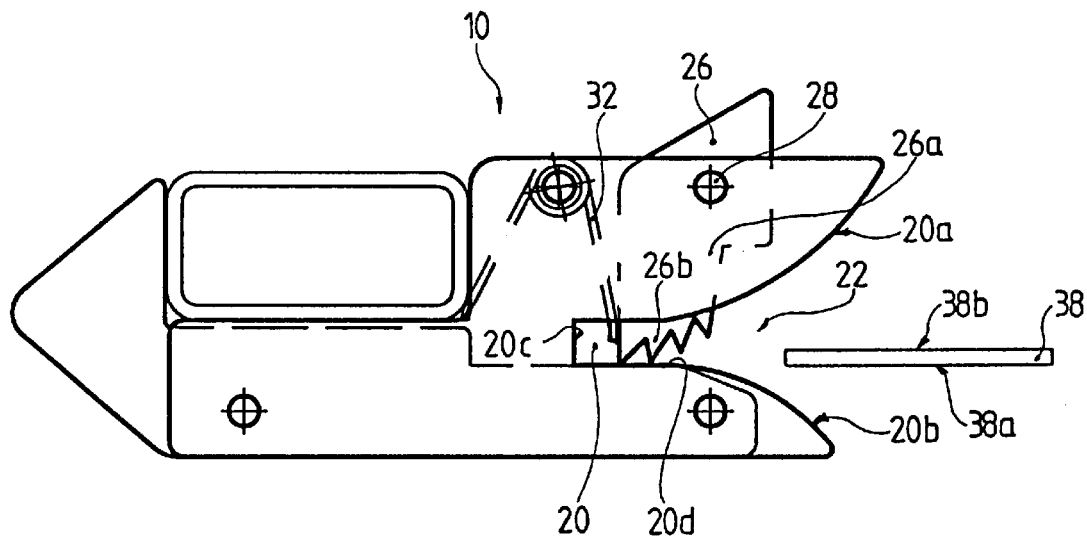
FIG. 3: is a side-view of the gripper in accordance with FIG. 1 before gripping a flat component.

In the following, the operation of the gripper 10 is described more closely with reference to FIGS. 3 and 4. To grip a flat component (38), for instance a circuit board, the component is inserted into the gripping slot (20) through the slot opening (22). In the course of this, the component (38) contacts the slot wall (20d), shown on the bottom in FIGS. 3 and 4, of the gripping slot (20) with its bottom surface. As soon as the component (38) comes in contact with the clamping segment (26a) of the clamping element (26), the clamping element (26) is pivoted clockwise in the direction of the slot end (20c), against the force of the torsion spring (32), causing at least one of the teeth (26b) to touch the top surface (38b) of the component (38).

Figure 4:
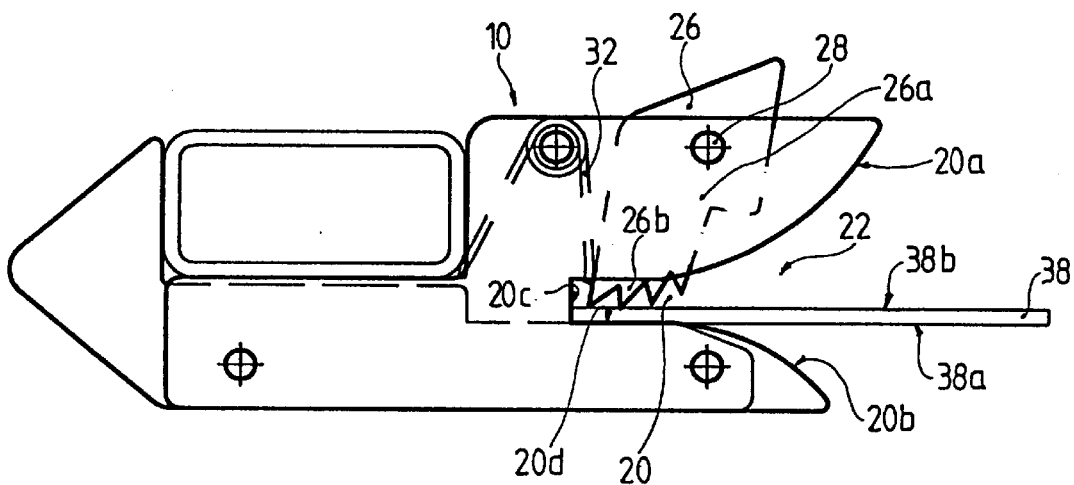
FIG. 4: is a side-view of the gripper in accordance with FIG. 1 while gripping a flat component.

As soon as the insertion of the component (38) is completed, as shown in FIG. 4, and the edge of the component (38) contacts the slot end (20c) of the gripping slot (20), the clamping element (26) is tensioned counterclockwise by the force of the torsion spring (32). One of the teeth (26b) then contacts the top surface (38b) of the component (38) under tension, which clamps the component (38) in the gripping slot (20).

To release the component (38), the operator can depress the setting segment (26c) of the clamping element (26), which protrudes from the gripper body (12), in the direction of the gripper body (12), which pivots the clamping element (26) clockwise about the pivot pin (28). This disengages the teeth (26b) from the top surface (38b) of the component (38), so that the component (38) can be removed from the gripper slot (20).

FIGS. 5 and 6 show another possibility for opening the gripper (10). In FIGS. 5 and 6, an opening device (40) with a U-shaped cross-section is shown. The opening device (40) consists of two L-sections (42 and 44), which are connected to each other by their short flanges (42a and 44a), thereby forming the U-shaped opening device (40). The U-shaped opening device (40) is itself fastened to a profiled bar (46) with a screw (not shown). Each L-section (42 or rather 44), has a tab (48 or rather 50) on the free end of its long flange (42b or rather 44b), which is bent outward. This way the two tabs (48 and 50) form a widening insertion opening (52) of the U-shaped opening device (40). To open the gripper (10) that is gripping a flat component (38), it is inserted into the insertion opening (52) of the opening device (40) with the insertion segment (14c) of its center plate (14). In this process, the gripper (10) is guided into the insertion opening (52) by the tabs (48 and 50). As soon as the gripper (10) is inserted into the opening device (40), its bottom contacts the bottom tab (50) of the lower L-section (44). At the same time, the top tab (48) contacts the setting segment (26c) of the clamping element (26) and pivots the clamping element (26) clockwise during the insertion of the gripper (10) into the opening device (40). This pivots the clamping element (26) into the open position and releases the flat component (38). After the flat component has been removed, the gripper (10) can be pulled back out of the opening device (40), and is ready to transport another flat component (38).

FIG. 7 shows a top-view of a gripper system (60) that uses a total of six of the previously described grippers (10). The gripper system (60) has a first beam (62) that is mounted on two guide shafts (64 and 66) and protrudes from these at a right angle. Parallel to the first beam (62) is a second beam (68) that is mounted on the guide shafts (64 and 66) by means of a carriage (70) and can be moved along the guide shafts (64 and 66) parallel to the first beam (62) by means of a propulsion unit (not shown). The gripper system (60) is itself mounted movably on a gantry (not shown), and can be moved axially in three directions at right angles to each other, as well as rotated about three axes at right angles to one another.

Three identical grippers (62a or rather 68a), whose construction is in keeping with the construction of the gripper (10), are mounted on each of the beams (62 and 68). The grippers (62a) of the first beam (62) are aligned with the grippers (68a) of the second beam (68), with their gripping slots oriented in the direction of the second beam (68). The grippers (68a) of the second beam (68) are, in turn, oriented with their gripping slots toward the gripping slots of the grippers (62a) of the first beam (62). Furthermore, a support (62b or rather 68b) is mounted on the first beam (62), or rather the second beam (68), between each neighboring gripper (62a) of the first beam (62) and each of the grippers (68a) of the second beam (68) neighboring each other.

The operation of the gripper system (60) is explained in the following. As soon as a flat component (38) is to be picked up by the gripper system (60), the second beam (68) is moved into a pick-up position by the propulsion unit (not shown), in which it rests against a stop (72), shown on the left in FIG. 7, of the guide shafts (64 and 68). The gripper system (60) is then lowered by the gantry (not shown) in such a way that the flat component (38) is positioned between the first beam (62) and the second beam (68). After this, the second beam (68) is moved in the direction of the first beam (62) by the propulsion unit (not shown), through which the grippers (68a) on the second beam (68) engage one of the edges of the flat component (38) with their gripping slots, and the grippers (68a) thus grasp the component (38). At the same time, the motion of the second beam (68) pushes the flat component (38) in the direction of the first beam (62), whose grippers (62a) also engage the flat component (38) and thus grasp the flat component. Especially with very thin components, the supports (62b or rather 68b), positioned between the grippers (62a or rather 68a), prevent a sagging of the flat component, which would make the transport and gripping of the component (38) more difficult.

After the gripper system (68) has completed the transport, the gripper system (68) is moved with its first beam (62) toward three opening devices (40), mounted parallel to each other on a common profiled bar (46). The grippers (62a) of the first beam (62) are inserted into these opening devices (40), which opens the grippers (62a), so that the flat component is released. The second beam (68) is then moved back again to its starting position, in which it rests against the stop (72) of the guide shafts (64 and 66). During this process the grippers (68a) of the second beam (68) are opened by three correspondingly positioned opening devices (40), so that the component is released.

What is claimed is:

1. A gripper for flat components comprising: a gripper body having a top and a bottom that define a gripping slot therebetween with edges that form a slot opening, and the gripping slot is sized to receive a component, a clamping element pivotally mounted to the gripper body and biased to pivot into the slot opening and can be pivoted between a clamping position in which it protrudes into the gripping slot where it is adapted to clamp the component, and an open position in which it is pivoted at least partially out of the gripping slot, and a setting segment provided on the clamping element and which protrudes from the gripper body when the clamping element is in its clamping position, and is sloped, such that it forms a positioning surface that rises from the top and, in the open position of the clamping element, is parallel to the top; and an opening device having a U-shaped cross-section, with two legs that are at a distance to one another, between which the gripper can be inserted with its insertion end, located opposite the gripping slot, in such a manner that the bottom of the gripper, opposite its top, comes into contact with one of the legs, and that the other leg, adjoining the top, contacts the setting segment of the clamping element that protrudes from the top of the gripper, and pivots the clamping element into the open position during the insertion.

2. A gripper in accordance with claim 1 wherein a clamping segment is formed on the clamping element such that, in the clamping position, the clamping segment protrudes into the gripping slot and has at least one shaped element that is adapted to engage a surface of a component that inserted into the gripping slot in order to be gripped.

3. A gripper in accordance with claim 2 wherein the shaped element consists of several teeth arranged on a common arc, and that the clamping element is pivoted on the gripper in such a manner that the tooth that is closest to the slot end in the clamping position of the clamping element contacts the opposite slot wall when no component is inserted in the gripping slot.

4. A gripper in accordance with one of the claims 1 through 3 wherein the edges that form the slot opening of the gripping slot are rounded in such a manner that the slot opening is widened.

5. A gripper in accordance with claim 4 and further comprising a torsion spring to tension the clamping element into the clamping position.

6. A gripper in accordance with claim 5 wherein the torsion spring is mounted on a pin that runs parallel to the slot opening of the gripper, rests against the clamping element with one of its spring ends, and is affixed to the gripper with the other spring end.

7. A gripper in accordance with claim 1 and further comprising:
   at least one additional gripper,
   a first beam on which the first gripper is mounted, and
   a second beam, movable substantially parallel to the first beam, on which the at least one additional gripper is mounted,
   wherein the first gripper on the first beam is oriented with its gripping slot in the direction of the second beam and the at least one additional gripper, mounted on the second beam, is oriented with its gripping slot toward the gripping slot of the first gripper.

8. A gripper in accordance with claim 1 wherein the opening device comprises two L-shaped segments.

* * * * *

UNITED STATES PATENT AND TRADEMARK OFFICE
CERTIFICATE OF CORRECTION

PATENT NO. : 6,086,126
DATED : July 11, 2000
INVENTOR(S) : Rainer Krauss

It is certified that error appears in the above-identified patent and that said Letters Patent is hereby corrected as shown below:

Title Page,
Items [73] and [30] should read as follows:

[73] Assignee: Systronic Maschinenbau GmbH, Flein Germany

[30] Foreign Application Priority Data
October 7, 1997 [EP] European Pat. Off. . .97117335

Signed and Sealed this

Fourteenth Day of August, 2001

*Attest:*

*Attesting Officer*

NICHOLAS P. GODICI
*Acting Director of the United States Patent and Trademark Office*